(12) United States Patent
Zhou

(10) Patent No.: US 8,723,580 B2
(45) Date of Patent: May 13, 2014

(54) SIGNAL PROCESSING CIRCUIT

(75) Inventor: Junchao Zhou, Hefei (CN)

(73) Assignee: Mediatek Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/617,460

(22) Filed: Sep. 14, 2012

(65) Prior Publication Data
US 2013/0314141 A1 Nov. 28, 2013

(30) Foreign Application Priority Data
May 25, 2012 (CN) .......................... 2012 1 0166671

(51) Int. Cl.
*H03L 5/00* (2006.01)
(52) U.S. Cl.
USPC .......................... 327/307; 327/553; 327/554
(58) Field of Classification Search
USPC .......................................... 327/307, 553, 554
See application file for complete search history.

(56) References Cited

U.S. PATENT DOCUMENTS

| | | | |
|---|---|---|---|
| 7,525,366 B2 * | 4/2009 | Chen | 327/307 |
| 2002/0196717 A1 | 12/2002 | Masui et al. | |
| 2011/0133966 A1 * | 6/2011 | Ono | 341/118 |

* cited by examiner

*Primary Examiner* — John Poos
(74) *Attorney, Agent, or Firm* — McClure, Qualey & Rodack, LLP

(57) ABSTRACT

The present disclosure relates to a signal processing circuit. The signal processing circuit includes a signal selection module, an offset module, and an amplifier module. The signal selection module is configured to select one from a plurality of input signals for outputting at least one first output signal. The voltage offset module is configured to output an offset voltage. The amplifier module, coupled to the signal selection module and the voltage offset module, is configured to sample the first output signal from the signal selection module, and offset the first output signal according to the offset voltage output from the offset voltage module, and perform an amplification gain control and data buffering processes on the offset signal.

12 Claims, 2 Drawing Sheets

SIGNAL PROCESSING CIRCUIT

CROSS REFERENCE TO RELATED APPLICATIONS

This application claims priority of Chinese Patent Application No. 201210166671.6, filed on May 25, 2012, and the entirety of which is incorporated by reference herein.

BACKGROUND OF THE INVENTION

1. Field of the Invention

The present disclosure relates to circuitry, and in particular relates to a signal processing circuit and a signal processing method.

2. Description of the Related Art

Analog to digital signal conversion plays a crucial role in signal processing, for converting a continuous analog signal into discrete digital signals while performing digital signal processing. Conventionally, a multiple-signal processing circuit employs a circuit structure that includes a plurality of pre-amplifiers, a signal selection module, and a sample/hold amplifier connected in sequence. In which, the plurality of the pre-amplifiers are configured to receive multiple input signals to perform offset and gain control. The signal selection module selects one signal from the plurality of the pre-amplifier output signals for transferring to the input port of the sample/hold amplifier for sampling or holding of the transferred signal.

However, in the conventional approach, before transfer to the sample/hold amplifier, signal offset and gain control by the plurality of pre-amplifiers must be performed on the input signal. Thus, each input signal requires a corresponding pre-amplifier. As the number of input signals increases, the circuit complexity and circuit area increases accordingly. Thus, this is detrimental to circuit area reduction, resulting in increased manufacturing costs.

BRIEF SUMMARY OF THE INVENTION

A detailed description is given in the following embodiments with reference to the accompanying drawings.

An embodiment of a signal processing circuit is described, comprising a signal selection module, a voltage offset module and an amplifier module. The signal selection module is configured to select one from a plurality of input signals for outputting at least one first output signal. The voltage offset module is configured to output an offset voltage. The amplifier module, coupled to the signal selection module and the voltage offset module, is configured to ample the first output signal from the signal selection module, and offset the first output signal according to the offset voltage output from the offset voltage module, and perform an amplification gain control and data buffering processes on the offset signal.

Another embodiment of a signal processing circuit is provided, comprising an amplifier, a feedback amplification capacitor, a sample/hold capacitor, a signal selection module and a voltage offset module. The amplifier comprises a first input port, a second input port, and an output port for outputting signals. The feedback amplification capacitor is coupled between the first input port and the output port of the amplifier. The sample/hold capacitor is coupled to the output port of the amplifier. The signal selection module is configured to select one from a plurality of input signals, and selectively couple the selected input signal to the first input port of the amplifier through an input voltage sampling capacitor. The voltage offset module is configured to provide an offset voltage, coupled to the first input port of the amplifier through an offset voltage sampling capacitor, and selectively coupled to the output port of the amplifier through the offset voltage sampling capacitor. The sample/hold capacitor is operative in a sampling stage and a holding stage. When the sample/hold capacitor is in the sampling stage, the input voltage sampling capacitor, the offset voltage sampling capacitor, and the feedback amplification capacitor are configured to perform signal offset and amplification processes. When the sample/hold capacitor is in the holding stage, the input voltage sampling capacitor is configured to sample the input signal, the offset voltage sampling capacitor is configured to sample the offset voltage, and the feedback amplification capacitor is configured to be reset.

Another embodiment of a signal processing method is disclosed, comprising selecting one from a plurality of input signals for outputting at least one first output signal; providing an offset voltage; and sampling the first output signal, and offsetting the sampled first output signal according to the offset voltage, and performing an amplification gain control and data buffering processes on the offset signal, with an amplifier module.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
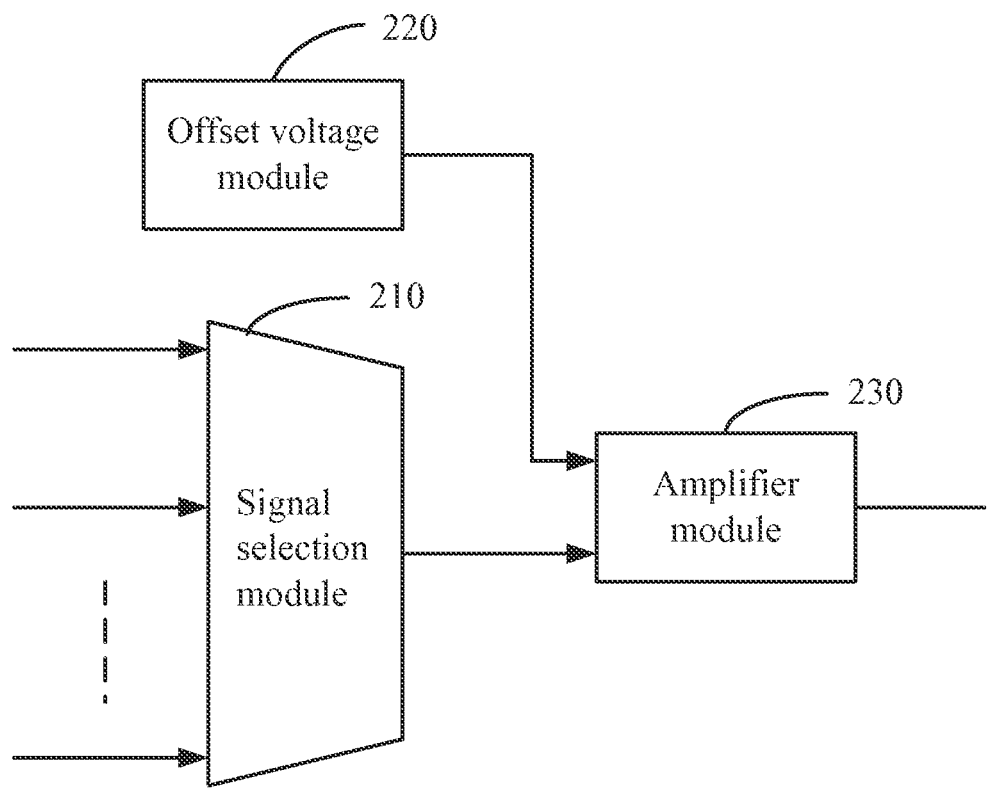
FIG. 1 is a block diagram of a signal processing circuit according to an embodiment of the invention.

FIG. 1 is a block diagram of a signal processing circuit according to an embodiment of the invention. The signal processing circuit comprises a signal selection module 210, an offset voltage module 220, and an amplifier module 230. The amplifier module 230 is coupled to the signal selection module 210 and the offset voltage 220.

The signal selection module 210 includes a plurality of input ports, wherein each input port can receive an input signal. The signal selection module 210 can select one from the plurality of the input signals to be output.

The offset voltage module 220 can output an offset voltage to the amplifier module 230 for offsetting the output signal from the signal selection module 210.

The amplifier module 230 can sample at least one first output signal from the signal selection module 210, and offset the first output signal from the signal selection module 210 according to the offset voltage from the offset voltage module 220, and perform gain control and data buffering to the offset signal.

Figure 2:
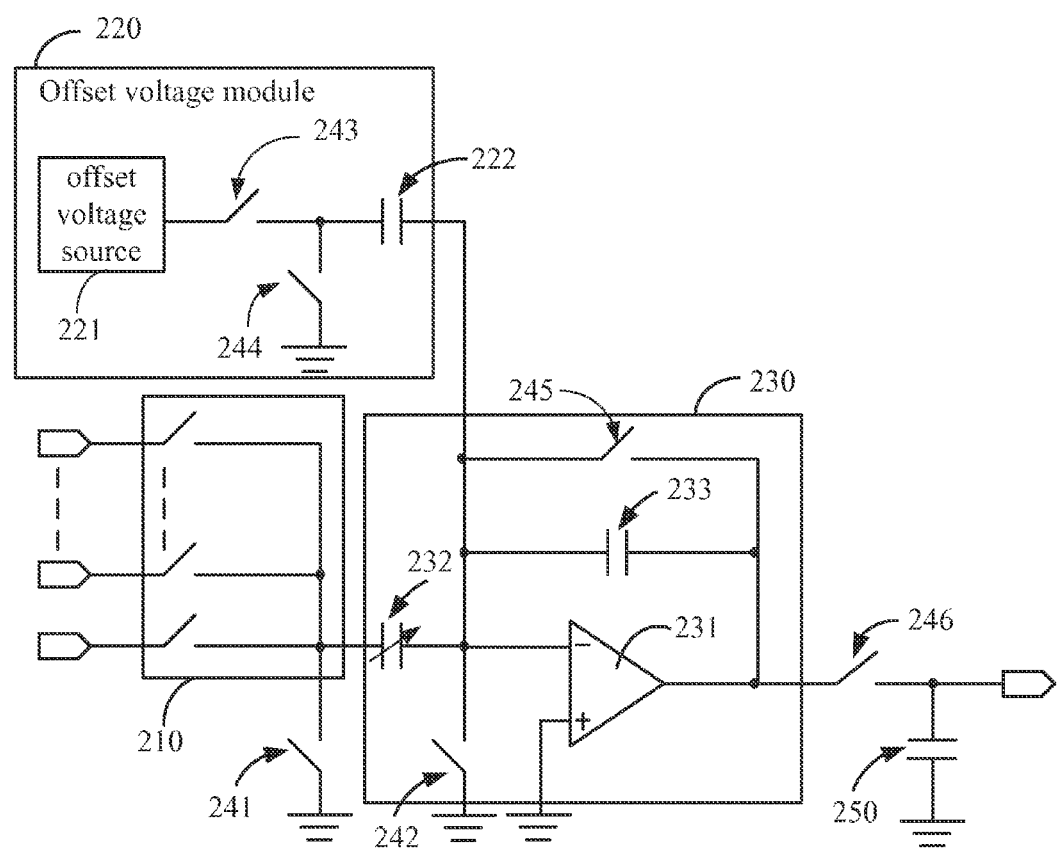
FIG. 2 is a circuit schematic of a signal processing circuit according to an embodiment of the invention.

FIG. 2 is a circuit schematic of a signal processing circuit according to an embodiment of the invention, comprising the signal selection module 210, the offset voltage module 220, the amplifier module 230, a first switch 241, a sixth switch 246, and a sample/hold capacitor 250.

The plurality of input ports of the signal selection module 210 can receive the multiple input signals. The input ports of the signal selection module 210 are coupled to the first switch 241, selectively outputting the first output signal thereto. In the embodiment, the signal selection module 210 includes a plurality of switches, which are electrically connected in parallel, controlled to be turned on or turned off according to a user command or an automatic control system, thereby selectively providing connection for one or more input signals.

The first switch 241 includes a first port and a second port, wherein the first port of the first switch 241 is coupled between the signal selection module 210 and the amplifier module 230, and the second port of the first switch 241 is coupled to the ground. The first switch 241 is operative to selectively couple the first output signal to the ground terminal.

The offset voltage module 220 includes an offset voltage source 221, an offset voltage sampling capacitor 222, a third switch 243, and a fourth switch 244.

The third switch 243 includes a first port and a second port, wherein the first port of the third switch 243 is coupled to the offset voltage source 221 to provide an offset voltage. The fourth switch 244 includes a first port and a second port, wherein the first port of the fourth switch 244 is coupled between the second port of the third switch 243 and the offset voltage sampling capacitor 222, and the second port of the fourth switch 244 is coupled to the ground. The offset voltage sampling capacitor 222 is coupled between a first input port of an amplifier 231 and the second port of the third switch 243. The offset voltage source 221 can selectively provide the offset voltage to the offset voltage sampling capacitor 222 through the third switch 243.

The amplifier module 230 comprises the amplifier 231, an input voltage sampling capacitor 232, a feedback amplification capacitor 233, a second switch 242, and a fifth switch 245.

The amplifier 231 includes a first input port, a second input port, and an output port for outputting a signal. The input voltage sampling capacitor 232 is coupled between the first input port of the amplifier 231 and the signal selection module 210, for receiving the first output signal from the signal selection module 210. The feedback amplification capacitor 233 is coupled between the first input port and the output port of the amplifier 231. The second switch 242 includes a first port and a second port, wherein the first port of the second switch 242 is coupled between the first input port of the amplifier 231 and the input voltage sampling capacitor 232, and the second port of the second switch 242 is coupled to the ground. The fifth switch 245 includes a first port and a second port, wherein the first port of the fifth switch 245 is coupled between the first input port of the amplifier and the offset voltage sampling capacitor 222, and the second port of the fifth switch is coupled to the output port of the amplifier 231. The sixth switch 245 includes a first port and a second port, wherein the first port of the sixth switch 245 is coupled between the output port of the amplifier 231 and the second port of the fifth switch 245, and the second port of the sixth switch 245 is coupled to the ground through the sample/hold capacitor 250 and to a second output signal concurrently. The second output signal is employed by a successive circuit (not shown).

The sample/hold capacitor 250 includes two terminals. One terminal is coupled to the output port of the amplifier 231, and the other terminal is coupled to the ground.

In use, the signal processing circuit can operate in a sampling stage and a holding stage. During the sampling stage the sample/hold capacitor 250 can sample a signal, and during the holding stage the sample/hold capacitor 250 can hold the sampled signal.

Specifically, when the signal processing circuit operates in the holding stage, the first switch 241, the fourth switch 244 and the sixth switch 246 are turned off (opened), while the second switch 242, the third switch 243, the fifth switch 245, and one of the switches in the signal selection module 210 are turned on (closed). Concurrently, the input voltage sampling capacitor 232 can receive and sample the first input signal when being charged by the first input signal. The offset voltage sampling capacitor 222 can receive and sample the offset voltage signal supplied by the offset power source 221 when being charged by the offset voltage signal. The fifth switch 245 is closed, then the feedback amplification capacitor 233 is in a reset status. The sixth switch 246 is opened to decouple the amplifier 231 from the sample/hold capacitor 250, rendering the sample/hold capacitor to hold the voltage signal acquired in the sampling stage, which is passed to the successive circuit to match the circuit speed of the two successive circuits.

On the other hand, when the signal processing circuit operates in the sampling stage, the first switch 241, the fourth switch 244 and the sixth switch 246 are all turned on (closed), while the second switch 242, the third switch 243, the fifth switch 245, and all of the control switches of the signal selection module 210 are turned off (opened). As such, the input voltage sampling capacitor 232 can be decoupled from the signal selection module 210, and the offset voltage sampling capacitor 222 can be decoupled from the offset power source 221, thus the input voltage sampling capacitor 232, the offset voltage sampling capacitor 222, and the feedback amplification capacitor 233 can offset and amplify the input signal (in an offset and amplification stage). Since the sixth switch 246 is closed, the output voltage signal of the amplifier 231 can charge the sample/hold capacitor 250, allowing the sample/hold capacitor 250 to operate in the sampling stage. Accordingly, the output voltage signal of the amplifier 231 can charge the sample/hold capacitor 250, thereby providing a buffering function.

The principle of the circuit operation is explained in detail as follows. When the first switch 241 and the fourth switch 244 are closed, the first port of the input voltage sampling capacitor 232 is coupled to the ground through the first switch 241, and the offset voltage sampling capacitor 222 is coupled to the ground through the fourth switch 244. Due to the virtual short-circuit effect of the amplifier 231, the second port of the input voltage sampling capacitor 232 and the second port of the offset voltage sampling capacitor 222 are coupled to the ground, rendering the voltage difference of the input voltage sampling capacitor 232 and the offset voltage sampling capacitor 222 to be substantially 0. Thus, the electrical charges in the voltage sampling capacitor 232 and the offset voltage sampling capacitor 222 are pushed to the feedback amplification capacitor 233, thereby the input signal is offset and amplified.

The output voltage $V_{out}$ of the amplifier 231 can be expressed by the equation Eq. [1]:

$$V_{out} = \frac{C_1}{C_2} V_{in} + \frac{C_3}{C_2} V_{of} \qquad \text{Eq. [1]}$$

wherein $V_{out}$ is the output voltage of the amplifier 231;

$C_1$ is a capacitance value of the voltage sampling capacitor 232;

$C_2$ is a capacitance value of the feedback amplification capacitor 233;

$V_{in}$ is an input voltage selected from the multiple input voltages;

$C_3$ is a capacitance value of the offset voltage sampling capacitor 222; and $V_{of}$ is the output voltage of the offset power source 221;

The equation Eq. [1] shows that the output voltage $V_{of}$ of the offset power source 221 is combined with the input voltage $V_{in}$, so that the input voltage $V_{in}$ can be offset based on the output voltage $V_{of}$ of the offset power source 221.

Notably, in the embodiments, the voltage sampling capacitor 232 is a variable capacitor adjustable to vary the capacitance thereof, providing the gain control for the signal processing circuit. As shown in the equation Eq. [1], when the signal processing circuit is in the sampling stage, if the capacitance value $C_1$ of the voltage sampling capacitor 232 varies and the other parameters in the equation remain unchanged, the output voltage $V_{out}$ of the amplifier 231 varies with the capacitance value $C_1$ of the voltage sampling capacitor 232, thereby providing the gain control for the signal processing circuit. Alternately, in other embodiments, the offset voltage sampling capacitor 222 and feedback amplification capacitor 233 are both variable capacitors. The capacitances of the offset voltage sampling capacitor 222 and feedback amplification capacitor 233 can be varied proportionally to each other, providing the gain control for the signal processing circuit. As depicted by the equation Eq. [1], when the capacitance value $C_2$ of the offset voltage sampling capacitor 222 and the capacitance value $C_3$ of the feedback amplification capacitor 233 are varied by a predetermined proportion, while maintaining the other parameters in the equation unchanged, the output voltage $V_{out}$ of the amplifier 231 varies with the capacitances of the offset voltage sampling capacitor 222 and/or the feedback amplification capacitor 233, thereby still providing the gain control for the signal processing circuit.

Accordingly, in the above embodiments, an amplifier and a sample buffer are integrated into the amplifier module 230 to realize signal amplification and data buffering processes for multiple input signals, thus the circuit structure is simplified, circuit area is reduced, and manufacturing cost is decreased for the signal processing circuit.

Also, by varying the capacitance(s) of the voltage sampling capacitor 232 or that of the offset voltage sampling capacitor 222 and the feedback amplification capacitor to within a predetermined proportion, the gain control of the signal processing circuit can be realized.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device, discrete gate or transistor logic, discrete hardware components or any combination thereof designed to perform the functions described herein. A general purpose processor may be a microprocessor, but in the alternative, the processor may be any commercially available processor, controller, microcontroller or state machine.

The operations and functions of the various logical blocks, modules, and circuits described herein may be implemented in circuit hardware or embedded software codes that can be accessed and executed by a processor.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A signal processing circuit, comprising:
   a signal selection module, configured to select one from a plurality of input signals for outputting at least one first output signal;
   a voltage offset module, configured to output an offset voltage; and
   an amplifier module, coupled to the signal selection module and the voltage offset module, configured to sample the first output signal from the signal selection module, and offset the first output signal according to the offset voltage output from the offset voltage module, and perform an amplification gain control and data buffering processes on the offset signal; wherein the amplifier module comprises:
   an amplifier, comprising a first input port, a second input port, and an output port for output;
   an input voltage sampling capacitor, coupled between the signal selection module and the first input port of the amplifier, wherein the input voltage sampling capacitor is a variable capacitor; and
   a feedback amplification capacitor, coupled between the first input port and the output port of the amplifier, wherein
   the signal processing circuit is configured to operate in a sampling stage and a holding stage, and when the signal processing circuit is in the sampling stage, the input voltage sampling capacitor and the feedback amplification capacitor are configured to amplify the first output signal, and when the signal processing circuit is in the holding stage, the input voltage sampling capacitor is configured to sample the first output signal, and the feedback amplification capacitor is in a reset status.

2. The signal processing circuit of claim 1, wherein the voltage offset module comprises:
   an offset voltage source, configured to provide the offset voltage; and
   an offset voltage sampling capacitor, coupled between the first input port of the amplifier and the offset voltage source.

3. The signal processing circuit of claim 2, wherein:
   the input voltage sampling capacitor comprises a first port and a second port, and when the signal processing circuit is in the sampling stage, the first port of the input voltage sampling capacitor is decoupled from the signal selection module, and when the signal processing circuit is in the holding stage, the first port of the input voltage sampling capacitor is coupled to the signal selection module; and the second port of the input voltage sampling capacitor is coupled to the first input port of the amplifier; and
   the offset voltage sampling capacitor comprises a first port and a second port, and when the signal processing circuit is in the sampling stage, the first port of the offset voltage sampling capacitor is decoupled from the offset voltage source, and when the signal processing circuit is in the holding stage, the first port of the offset voltage sampling capacitor is coupled to the offset voltage source, and the second port of the offset voltage sampling capacitor is coupled to the first input port of the amplifier.

4. The signal processing circuit of claim 2, further comprising a sample/hold capacitor with two terminals, wherein one terminal is coupled to the output port of the amplifier, and the other terminal is coupled to the ground.

5. The signal processing circuit of claim 4, further comprising:
a first switch comprising a first port and a second port, wherein the first port is coupled between the signal selection module and the input voltage sampling capacitor, and the second port is coupled to the ground;
a second switch, comprising a first port and a second port, wherein the first port is coupled between the first input port of the amplifier and the input voltage sampling capacitor, and the second port is coupled to the ground;
a third switch, comprising a first port and a second port, wherein the first port is coupled to the offset voltage source, and the second port is coupled to the first port of the offset voltage sampling capacitor;
a fourth switch, comprising a first port and a second port, wherein the first port is coupled between the second port of the third switch and the offset voltage sampling capacitor, and the second port is coupled to the ground;
a fifth switch, comprising a first port and a second port, wherein the first port is coupled between the first input port of the amplifier and the offset voltage sampling capacitor, and the second port is coupled to the output port of the amplifier; and
a sixth switch, comprising a first port and a second port, wherein the first port is coupled between the output port of the amplifier and the second port of the fifth switch, and the second port is coupled to the ground through the sample/hold capacitor, wherein
when the signal processing circuit is in the sampling stage, the first, fourth, and sixth switches are turned on, and the second, third, and fifth switches and all switches of the signal selection module are turned off, and
when the signal processing circuit is in the holding stage, the first, fourth, and sixth switches are turned off, and the second, third, and fifth switches and one switch of the signal selection module are turned on.

6. The signal processing circuit of claim 4, wherein the offset voltage sampling capacitor and the feedback amplification capacitor are variable capacitors with capacitance adjustable within a predetermined proportion.

7. The signal processing circuit of claim 3, wherein when the signal processing circuit is in the sampling stage, the output voltage of the amplifier can be expressed by a following equation:

$$V_{out} = \frac{C_1}{C_2} V_{in} + \frac{C_3}{C_2} V_{of} \qquad \text{Eq. [1]}$$

wherein
Vout is the output voltage of the amplifier;
$C_1$ is a capacitance value of the voltage sampling capacitor;
$C_2$ is a capacitance value of the feedback amplification capacitor;
$V_{in}$ is the input voltage selected from the multiple input voltages;
$C_3$ is a capacitance value of the offset voltage sampling capacitor; and
$V_{of}$ is the output voltage of the offset voltage source.

8. A signal processing circuit, comprising:
an amplifier, comprising a first input port, a second input port, and an output port for outputting signals;
a feedback amplification capacitor, coupled between the first input port and the output port of the amplifier;
a sample/hold capacitor, coupled to the output port of the amplifier; and
a signal selection module, configured to select one from a plurality of input signals, and selectively couple the selected input signal to the first input port of the amplifier through an input voltage sampling capacitor; and
a voltage offset module, configured to provide an offset voltage, coupled to the first input port of the amplifier through an offset voltage sampling capacitor, and selectively coupled to the output port of the amplifier through the offset voltage sampling capacitor,
wherein the sample/hold capacitor is operative in a sampling stage and a holding stage, and
when the sample/hold capacitor is in the sampling stage, the input voltage sampling capacitor, the offset voltage sampling capacitor, and the feedback amplification capacitor are configured to perform signal offset and amplification processes, and
when the sample/hold capacitor is in the holding stage, the input voltage sampling capacitor is configured to sample the input signal, the offset voltage sampling capacitor is configured to sample the offset voltage, and the feedback amplification capacitor is configured to be reset.

9. The signal processing circuit of claim 8, wherein,
when the signal processing circuit is in the sampling stage, the voltage offset module is configured to charge the offset voltage sampling capacitor, and the signal selection module is configured to select the input signal to charge the input voltage sampling capacitor for sampling of the offset voltage, and
when the signal processing circuit is in the holding stage, charges in the offset voltage sampling capacitor and the input voltage sampling capacitor are pushed to the feedback amplification capacitor for offsetting and amplifying the input signal.

10. A signal processing method, comprising:
selecting one from a plurality of input signals for outputting at least one first output signal;
providing an offset voltage; and
sampling the first output signal, and offsetting the sampled first output signal according to the offset voltage, and performing an amplification gain control and data buffering processes on the offset signal, with an amplifier module; wherein the amplifier module comprises an amplifier, an input voltage sampling capacitor coupled in front of the amplifier, a sample/hold capacitor coupled between the amplifier and the ground, and a feedback amplification capacitor coupled in parallel with the amplifier with an end coupled between the input voltage sampling capacitor and the amplifier; and
wherein the signal processing method further comprises:
during a sampling stage, the input voltage sampling capacitor and the feedback amplification capacitor amplifying the input signal, and during a holding stage, the input voltage sampling capacitor sampling the input signal, and the feedback amplification capacitor being in a reset status; and
performing the step of data buffering processes with the amplifier cooperating with the sample/hold capacitor.

11. The signal processing method of claim 10, wherein the offset voltage is provided by a voltage offset module, the voltage offset module comprises:
an offset voltage source configured to provide the offset voltage; and
an offset voltage sampling capacitor coupled between the amplifier and the offset voltage source.

12. The signal processing method of claim 11, wherein the input voltage sampling capacitor comprises a first port and a second port, and the offset voltage sampling capacitor comprises a first port and a second port, wherein the signal processing method further comprises:

during the sampling stage, decoupling the first port of the input voltage sampling capacitor from the first output signal, and decoupling the first port of the offset voltage sampling capacitor from the offset voltage source; and during the holding stage, coupling the first port of the input voltage sampling capacitor to the first output signal, coupling the second port of the input voltage sampling capacitor to the amplifier, coupling the first port of the offset voltage sampling capacitor to the offset voltage source, and coupling the second port of the offset voltage sampling capacitor to the amplifier.

* * * * *